(12) United States Patent
Stewart

(10) Patent No.: US 7,132,950 B2
(45) Date of Patent: Nov. 7, 2006

(54) POWER MANAGEMENT METHOD AND SYSTEM

(76) Inventor: William L. Stewart, 17250 Knoll Trail #407, Dallas, TX (US) 75248

( * ) Notice: Subject to any disclaimer, the term of this patent is extended or adjusted under 35 U.S.C. 154(b) by 14 days.

(21) Appl. No.: 10/487,717

(22) PCT Filed: Aug. 30, 2002

(86) PCT No.: PCT/US02/27731

§ 371 (c)(1),
(2), (4) Date: Feb. 27, 2004

(87) PCT Pub. No.: WO03/021547

PCT Pub. Date: Mar. 13, 2003

(65) Prior Publication Data

US 2004/0212512 A1 Oct. 28, 2004

(51) Int. Cl.
*G01O 17/00* (2006.01)
(52) U.S. Cl. .................. 340/635; 340/664; 340/657; 340/658; 324/76.11; 324/142; 702/187
(58) Field of Classification Search ........... 340/310.01, 340/310.07, 635, 657, 658, 664; 324/76.11, 324/142; 702/187
See application file for complete search history.

(56) References Cited

U.S. PATENT DOCUMENTS

| | | | |
|---|---|---|---|
| 4,147,978 A * | 4/1979 | Hicks ..................... 324/142 |
| 4,689,752 A | 8/1987 | Fernandes et al. ........... 364/492 |
| 4,709,339 A | 11/1987 | Fernandes ................... 364/492 |
| 5,757,283 A | 5/1998 | Janoska .................. 340/870.16 |
| 5,959,449 A | 9/1999 | Winkler ...................... 324/117 |
| 5,982,276 A | 11/1999 | Stewart ................. 340/310.01 |
| 6,057,674 A | 5/2000 | Bangerter ..................... 323/211 |
| 6,064,343 A | 5/2000 | Crowley et al. ............ 343/702 |
| 6,100,757 A | 8/2000 | Kotzamanis ................. 330/151 |
| 6,121,559 A | 9/2000 | Bassin .......................... 200/81 |
| 6,157,527 A | 12/2000 | Spencer et al. ............... 361/64 |
| 6,191,563 B1 | 2/2001 | Bangerter ..................... 323/211 |
| 6,229,439 B1 | 5/2001 | Tice ........................... 340/506 |
| 6,233,163 B1 | 5/2001 | Lin et al. ....................... 363/41 |
| 6,247,246 B1 | 6/2001 | Scalese et al. ................ 34/259 |
| 6,259,996 B1 | 7/2001 | Haun et al. .................... 702/58 |
| 6,278,258 B1 | 8/2001 | Echarri et al. .............. 320/130 |
| 6,281,685 B1 | 8/2001 | Tuttle .......................... 324/529 |

FOREIGN PATENT DOCUMENTS

JP 59152703 8/1984

OTHER PUBLICATIONS

"Power Transmission Line of the Kyushu Electric Power Company," Ichiro Matsubara, et al., Sumitomo ELectric Technical Review, No. 42, Jun. 1996, 7 pages.

* cited by examiner

*Primary Examiner*—Julie Bichngoc Lieu
(74) *Attorney, Agent, or Firm*—Philip G. Meyers

(57) ABSTRACT

The present invention provides a new application for an inductive coupler (12) used proximate a power transmission line (14). The magnetic field based power measurement method and system discussed herein in unique and differs from the prior technology by using near-real time intervals and periods that occur systemically in parallel with electrical systems rather than an accumulated period with little or no active capacity or proactive features. The inductive coupler (12) described herewith is used to collect, measure, and/or extract electromagnetic changes.

20 Claims, 3 Drawing Sheets

POWER MANAGEMENT METHOD AND SYSTEM

TECHNICAL FIELD

The invention relates to management and distribution of electrical power, and in particular systems for monitoring the state of electrical power lines and distribution grids on a real time or near real time basis.

BACKGROUND OF THE INVENTION

Utility companies, power distribution companies and similar entities in the United States are currently handicapped by an inability to accurately monitor in real time the state of power lines and distribution grids. Thus, problems and inefficiencies often go undetected, resulting in needless expenditures and waste. The present invention is designed to address and rectify this situation.

Electrical power in the United States is largely transmitted in the form of alternating current at a predetermined frequency most frequently 60 Hz. As is known, when current passes through a transmission line, it generates an electro magnetic field that varies in frequency and intensity with the current flowing through the line. These fluctuations plotted against time, are in the form of a sinusoidal wave. As is also known, reflected waves traveling in the opposite direction of the current flow include harmonics, transients and variations that reflect conditions down the transmission line. Such harmonics, transients and variations in current and voltage as a function of time can be observed, characterized and analyzed using known mathematical techniques. See Arrillaga, *Power System Harmonic Analysis* (John Wiley & Sons, 1996), chapters 4, 6, 7 and 9. Events occurring to the transmission line such as shorts, lightning strikes, changes in load and similar conditions also generate transient variations that are reflected in the electro magnetic field surrounding the transmission line. The magnitude and frequency of such harmonics, transients and variations can be measured and in accordance with the invention, the data collected and processed to reflect events and occurrences affecting the transmission grid. Thus, in accordance with the invention, monitoring and measuring changes in the electro magnetic field surrounding the transmission line, enables real time or near real time monitoring of the state of the transmission line. The state of the line may be charged with high or low voltage, or be without current or charge. As used herein the terms "real time" and "near real time" refers to time required for a computer to receive and process one or more input data streams and output a signal or value based upon the input data. Thus, in most instances, "real time" will be measured in seconds or fractions of a second.

Stewart U.S. Pat. No. 5,982,276, the disclosure of which is hereby incorporated by reference, describes a system for communicating information between subscribers over power transmission lines which normally convey electrical power to a plurality of diverse electrical sites for providing electrical power to electrical devices disposed at these diverse electrical sites. This communication system makes use of an inductive coupling to receive the transmitted information from the magnetic field surrounding the power transmission line. The inductive coupler is preferably a ferroceramic type of inductive coupler having a sensitivity such as $10^{-23}$ volts. The present invention utilizes inductive couplers to detect changes in the electromagnetic field surrounding a transmission line, measures the changes and utilizes the data to identify conditions and events occurring on the transmission line.

SUMMARY OF THE INVENTION

The present invention provides a new application for an inductive coupler used proximate a power transmission line. The magnetic field based power measurement method and system discussed herein in unique and differs from the prior technology by using near-real time intervals and periods that occur systemically in parallel with electrical systems rather than an accumulated period with little or no active capacity or proactive features. The inductive coupler described herewith is used to collect, measure, and/or extract electromagnetic changes.

The present invention provides a system and method for gathering data from one or more inductive couplers. The collected data reflects power surges, demand shifts, and system breakdowns on a real time or near real time basis. Data collection may be timed by reference to an atomic clock signal in order to obtain accurate results from a plurality of locations at once. The system provides the capability of using the collected data in conjunction with stored data, such as historical data, local and nation power grid layout data, topographical information and dynamic information such as weather data to identify, characterize and locate power transmission problems and conditions that need attention.

DETAILED DESCRIPTION

Figure 1:
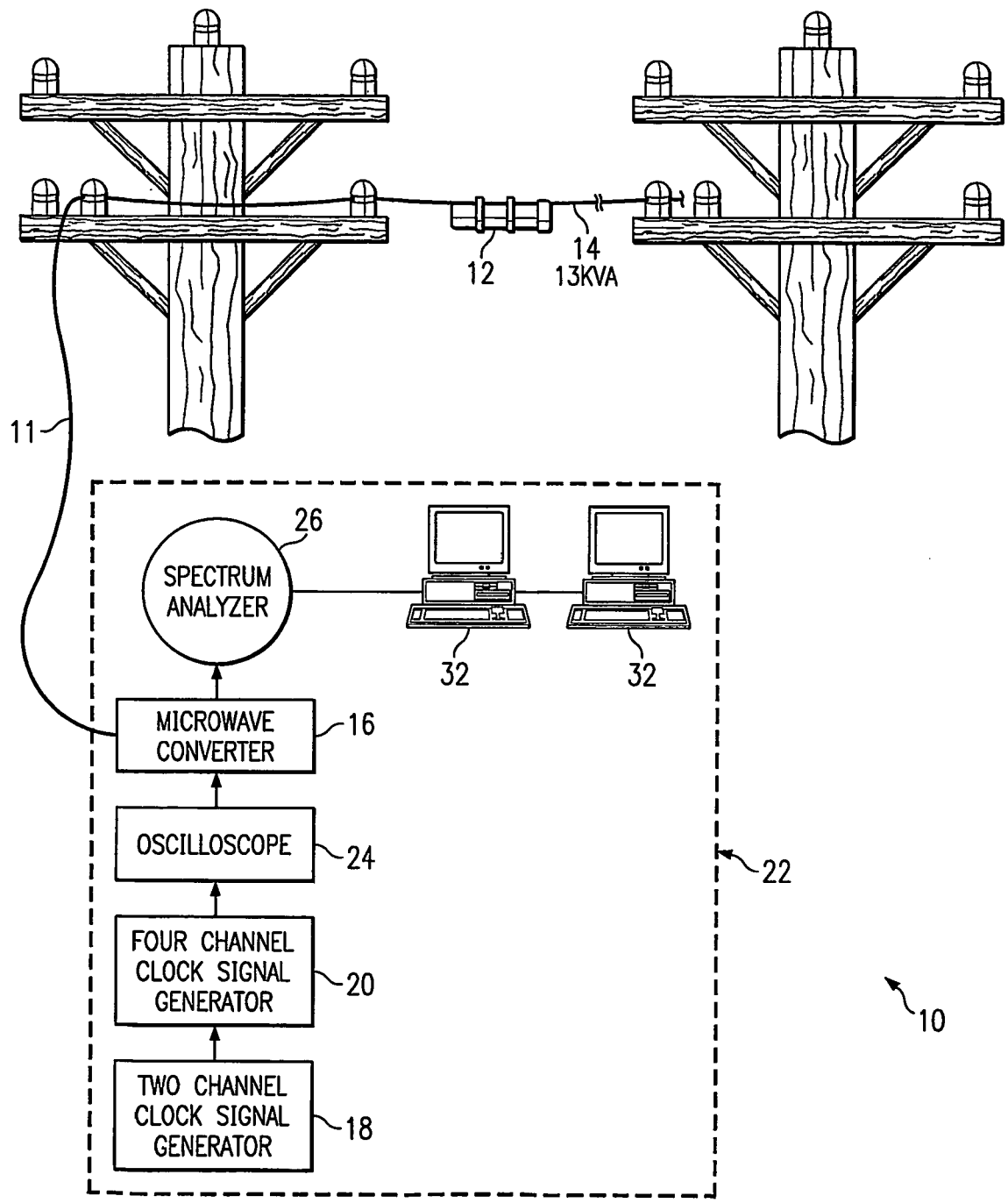
FIG. 1 is a schematic representation of a power management system according to the invention.
Figure 2:
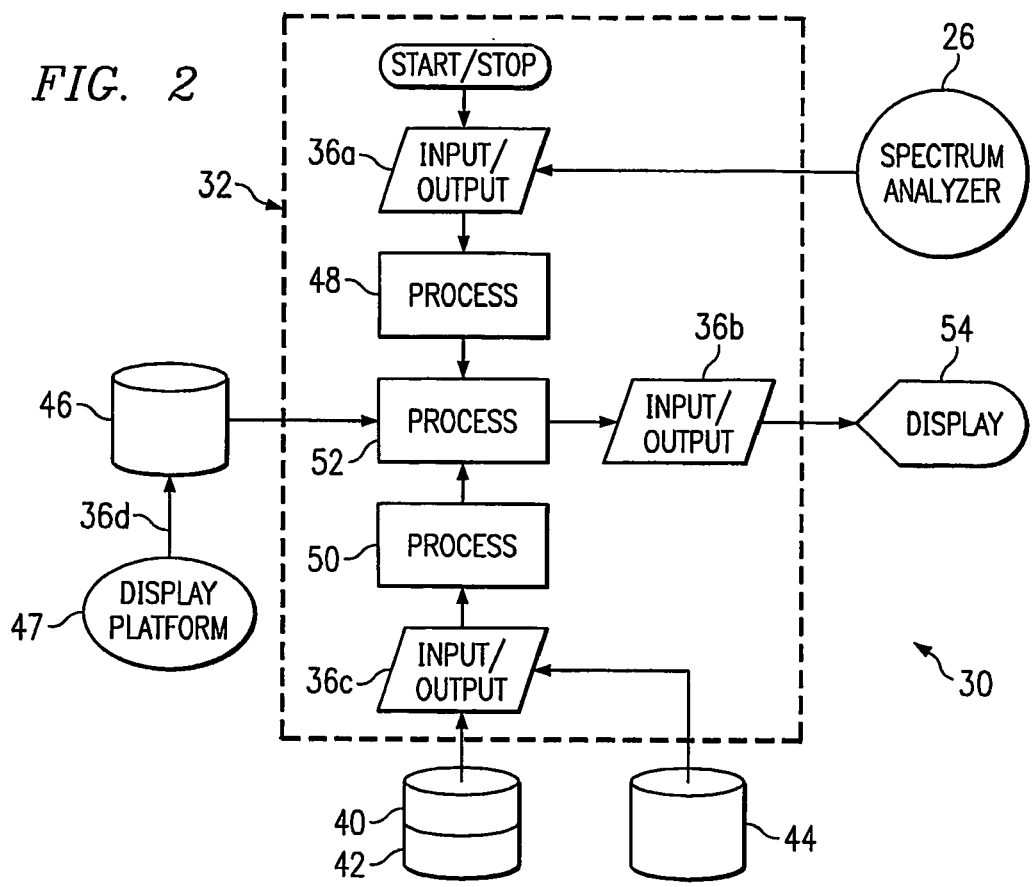
FIG. 2 is a flow chart illustrating steps utilized in the practice of the invention.

According to one embodiment of the invention as shown in FIGS. 1 and 2, a power management system 10 according to the invention includes one or more sensors (inductive couplers) 12 disposed in proximity to one or more power transmission lines 14. In practice, coupler 12 is clamped onto the power line at a convenient location in order to detect fluctuations in the voltage and current flowing through transmission line 14. As set forth in detail below, inductive coupler 12 includes an antenna and coils each of which are connected via a microwave cable 11 to a microwave converter 16 such as a HP model 8902 B analyzer, which filters the signals. Microwave cable 11 is configured similarly to a standard coaxial cable with a center conductor and an annular conductive shield, except that the shield of microwave cable 11 is typically a foil or layer of conductive material as opposed to the mesh used in typical coaxial cable. In the system illustrated in FIGS. 1 and 2, the center conductor of microwave cable is utilized as a first channel conductor and the shield is used as a second channel conductor.

As illustrated, a first two channel clock signal generator 18 and a second four channel clock signal generator 20 provide a clock signal on four channels, two of which are used for system calibration with the second two dedicated to sampling frequency. Currently available technology is limited to a clock frequency of approximately 300 Ghz, however, as faster clocks become available, it is anticipated that such faster signal generators may be utilized in the practice of the invention. The clock signals are input to a digital generator or oscilloscope 24 such as ESG signal generator model E4422B which in turn generates a reference waveform signal to converter 16 and spectrum analyzer 26. In one variation, spectrum analyzer 26 is a Hewlett Packard Series 89400 vector signal analyzer. Spectrum analyzer 26 utilizes the clock signal to convert the analog signals from microwave converter 16 into digital form. The digital data or Bitstream from analyzer 26, representing changes in the magnetic and electric fields surrounding power line 14, is input to a processing system 30 including one or more computers 32 and communications interfaces 36a, 36b, 36c (FIG. 2). Computer 32 may be local or remote relative to the other components. If computer 32 is at a distant location, then suitable means such as a network are provided for transmitting the output of analyzer 26 to computer 32.

In order to prevent spurious inference from signals in the power supply from interfering with the operation of the system components, converter 16, clock signal generators, 18 and 20, oscilloscope 24, analyzer 26 and computer 32, along with any associated auxiliary components, are enclosed within a Faraday cage 22. Additionally, the power source for these components is supplied from a source such as the primary side of the step down transformer supplying transmission line 14, the source being filtered to further isolate the components from transmission line 14.

As schematically represented in FIG. 2, system 30 includes a historical database 40 reflecting prior states of the transmission line 14 including a "normal state," data associated with prior events such as, lightning strikes, line failures or shorts and other abnormal conditions, along with the classification of such events. Database 40 is constructed using frequency and power measurements from inductive coupler 12 and associating the occurrence of known events such as lightning strikes, grounds, equipment failures and similar conditions with transients measured at the time of the event. For example, if a transformer shorts out, inductive coupler 12 will detect a transient resulting from the short and the data associated with the transient will be recorded in data base 40. When the cause of the transient is identified, it is logged into the database by an operator. Subsequently, when computer 32 observes a transient having the same or similar characteristics, it will identify the source of the transient as a transformer failure based upon the data recorded in historical database 40.

Figure 3:
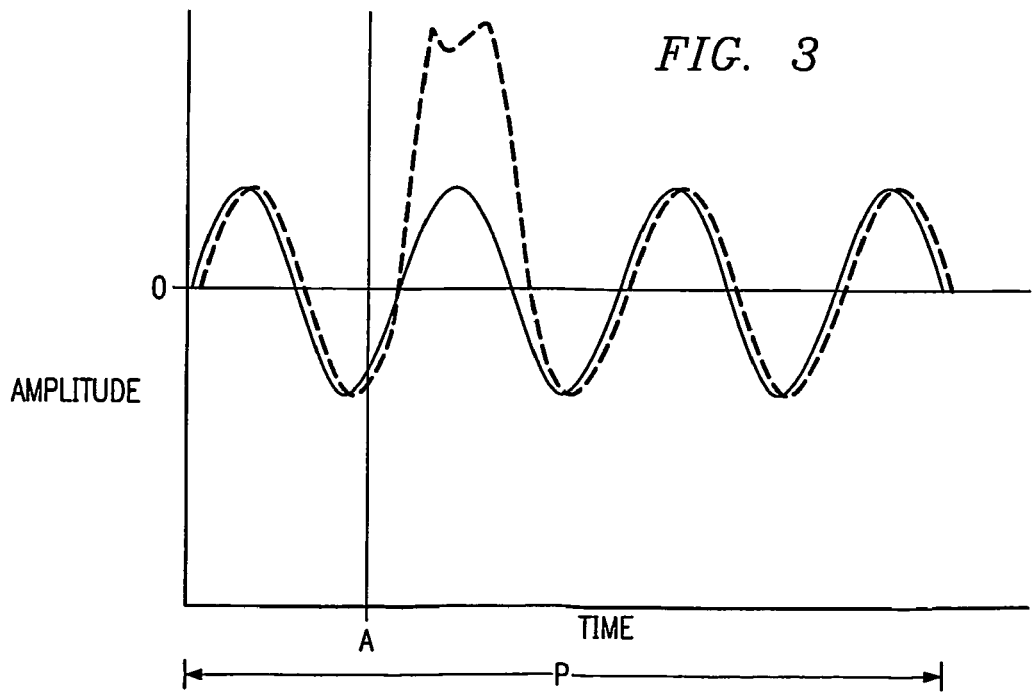
FIG. 3 is a graphical representation of an event detected by the system of FIG. 1.

An hypothetical example of an event is graphically represented in FIG. 3 wherein solid line represents historical data corresponding to the amplitude of a selected parameter, for example reflected voltage at a given frequency over a period p. A change in the amplitude of the amplitude of the parameter at a point during the period, represented by the dotted line at A, indicates an event or changed condition affecting the transmission of power over line 14. When computer 32 registers the change, the computer will search database 40 for a similar occurrence associated with a known event or condition and activate an alarm to alert the operator. It will be appreciated that the hypothetical example represented in FIG. 3 is only for the purpose of illustration; the actual parameters used to characterize the state of the transmission line may vary from case-to-case depending upon the particular system and will include values that are represented by complex numbers such as impedance or admittance (phasors), or multidimensional quantities (tensors) that include a component for each of a plurality of dimensions. See Arrillaga, *Power System Harmonic Analysis* (John Wiley & Sons, 1996)(chapter 10, describing iterative harmonic analysis). Analysis of the electro magnetic field surrounding a three-phase transmission line, in which the phases are 120° apart, becomes even more complex.

System 30 also includes a grid map of the local distribution system along with a national grid map maintained on one or more databases 42, along with National Means Data relating to the national transmission and distribution system that is maintained in a database 44. Geo-Spacial data such as the topography of the local distribution area is maintained on yet another database 46 which is linked via a graphic to a dynamic data collection, retrieval and display platform 47 such as Boeing Autometric's EDGE® system which includes tools for integrating imagery, maps, terrain, models and weather data.

Preferably, databases 40–46 are maintained on local storage media such an internal hard disk in computer 32, however, the data bases may be maintained on remote devices, accessed by computer 32 via a wireless or hardwired connection such as a telephone modem or network. In some cases, it may be desirable to distribute the computing function, depending upon the amount of data collected, the size of databases 40–46 and the desired output, in which case additional computers located either locally or remotely may be employed in addition to computer 32.

In operation, computer 32 receives collected and processed data from analyzer 26 and incrementally compares the data to historical data for a period corresponding to a portion of the base frequency cycle (60 Hz). For example, data collected for a period of one millionth of second beginning at a selected location in the cycle (between 0 and 360 degrees) can be compared to the corresponding increment from the historical database at step 50. If an abnormal condition is detected, typically in the form of a transient or a variation from the "normal" condition of transmission line 14, computer 32 attempts to identify the source of the abnormality by comparing the variation in the waveform to abnormalities associated with historical events stored in database 40.

For example, a lightning strike will generate a very large, very rapid increase in voltage along with an increase in current. On the other hand, the sudden opening of a large circuit breaker may also result in a voltage surge, however the duration of the surge will be different and the current will drop. Computer 32 will distinguish and identify the two different events based upon historical data associated with similar events that occurred in the past.

Depending upon the classification and magnitude of the event, computer 32 may also alert the system operator with an alarm. In the event that computer 32 is unable to classify the detected abnormality, computer 32 creates a new event classification for inclusion in the database. When the source or event causing the particular abnormality is identified, the database is updated.

In addition to identifying abnormal conditions and the source of such conditions, computer 32 determines the distance of the event or occurrence from the inductive coupler through the use of known mathematical techniques.

See Chowdhure, *Electromagnetic Transients in Power Systems*, (1996, Research Studies Press LTD and John Wiley & Sons, Inc., Chapters 2, 8 and 10). For example, in the case of a feeder line connected to several step-down transformers, a lightning strike to one of the stepped down lines will result in voltage and current transients as described above in the feeder line. Using one or more of historical data from database 40, the distance from the inductive coupler and the local grid map from data base 42, computer 32 can determine which of the segments was struck. Utilizing the local grid map from data base 42, computer 32 can then generate a graphical display including the grid map showing the location of the strike and output the map via interface 36b to a display such as CRT monitor 54. Further, in a preferred embodiment, computer 32 accesses Geo-Spacial data base 46 to include the topography of the area where the strike occurred into the graphical display, including access roads and similar information. If desired, computer 32 can also access data platform 47 to incorporate additional real time information such as weather conditions that may be the source of an abnormal condition along with other potentially useful information into the graphical display. All of the forgoing functions are performed on a real time basis.

Figure 4:
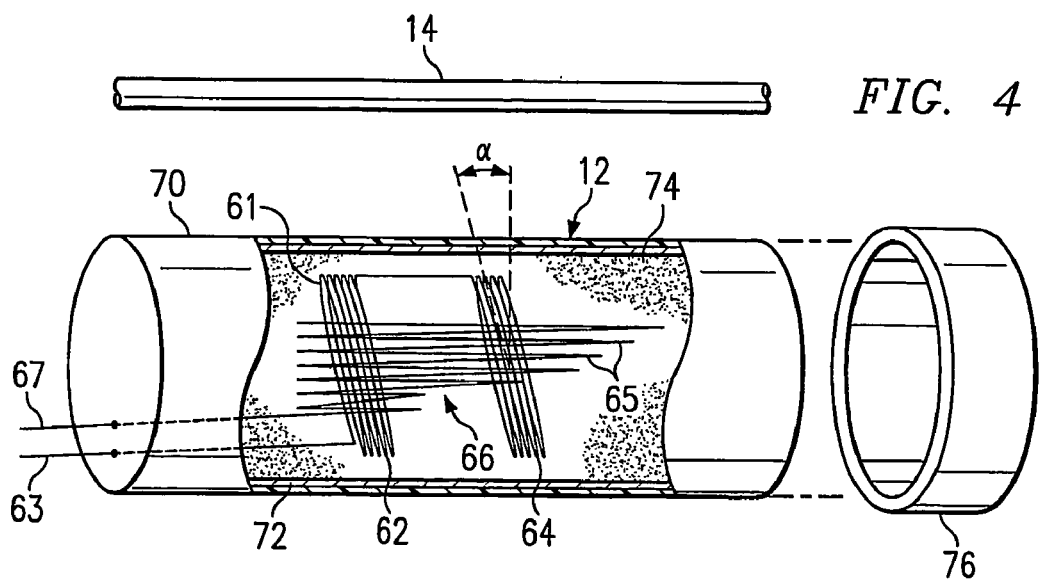
FIG. 4 is a schematic representation of an inductive coupler according to the invention.

Turning to FIGS. 1 and 4, an inductive coupler 12 clamped onto 13 KVA transmission line 14 to detect changes in the electro magnetic field surrounding the line includes first and second windings or coils 62 and 64 formed from a continuous piece of number 2 copper/aluminum alloy wire connected at a first end 63 to the center conductor of microwave cable 11 and terminating at an unconnected second end. Windings 62 and 64 are spaced approximately 10 cm apart and each include five turns 61 with a diameter of approximately 3 cm that are offset from a line perpendicular to a longitudinal axis of coupler 12 at an angle $\alpha$. Since coupler 12 is mounted with its longitudinal axis substantially parallel to transmission line 14, windings 62 are 64 are also offset from a line perpendicular to transmission line 14. As illustrated, windings 62 and 64 are configured and positioned to detect changes in the magnetic field surrounding transmission line 14 reflecting changes in the current flowing through the transmission line. The spacing of the coils relative to each other results in simultaneous measurements corresponding to two points on a waveform propagated along transmission line 14.

Since windings 62 and 64 are angled relative to a line perpendicular to transmission line 14, the current induced in windings 62 and 64 will be phase shifted relative to the current flowing through transmission line 14. Angle $\alpha$ may be varied within a range greater than 0 up to the limits imposed by the geometry of the other components of coupler 12; however, in a preferred embodiment, $\alpha$ is in the range of from 10 to 14 degrees and most preferably about 12 degrees (between 11 and 13 degrees).

Disposed within windings 62 and 64 is a millimeter band radio wave antenna 66 comprising a set of parallel grading windings 65 formed from a continuous length of number 2 copper/aluminum alloy having a first end 67 connected to the shield of microwave cable 11 and terminating at a second unconnected end. As illustrated, grading windings 65 of antenna 66 are positioned parallel to transmission line 14. Antenna 66 is configured by fractional wavelengths of harmonics based upon a 60-Hz transmission frequency with the length of the longest grading winding 65 being approximately 7.5 inches and the length of each of the shorter windings determined by parametric estimation of the differences between the wavelength of the harmonics. Antenna 66 is capable of detecting signals having a frequency of up to approximately 300 Ghz. As will be appreciated, antenna 66 is designed and positioned to detect the frequency and magnitude of voltage changes in transmission line 14. Further, since windings 62 and 64 are angled relative to antenna 66, the signal from windings 62 and 64 will also be phase-shifted relatively to the signal from antenna 66. Generating phase-shifted signals in this fashion provides for ease of computation when employing the above-referenced mathematical techniques used to process the signals from the windings and the antenna.

Windings 62 and 64 along with antenna 66 are enclosed in a non-conductive body or housing 70 such as a length of PVC pipe. In a preferred embodiment, the interior surface of housing 70 is coated with a conductive paint 72 in order to protect coupler 12 from lightning strikes. During the assembly of coupler 12, housing 70 is filled polycarbonate filler material 74 that serves to maintain windings 62 and 64 and 66 in position within the housing and isolate the windings and antenna from each other and from conductive coating 72. Housing 70 is also provided with end caps 76, (one shown) that are glued or otherwise secured onto housing 70. First end 63 of the wire forming windings 62 and 64 and first end 67 of the wire forming antenna 66 extend through a hole (not shown) in one of end caps 76 and are connected to microwave cable 11 in the manner described above.

As will be appreciated, currents and voltage fluctuations in transmission line 14 will induce corresponding currents and voltages in coils 62, 64 and antenna 66. Power management system 10 measures the magnitude, frequency and duration of these currents and voltages to identify conditions and events occurring on transmission line 14. Further, power management system 10, utilizing the appropriate mathematical techniques, can determine values for time and frequency dependent parameters such as impedance and reactance, as well as identifying changes in inductance and capacitance by analyzing changes or shifts in phase of voltage and current. Additionally, even more complex parameters, represented as tensors, may be determined using the data obtained via magnetic coupler 12. Each of such parameters provides a means of characterizing or modeling the condition of transmission line 14 on a real time basis that individually or when combined with other parameters, provides a means of identifying and characterizing events and conditions on transmission line 14 that has not been previously been available.

Figure 5:
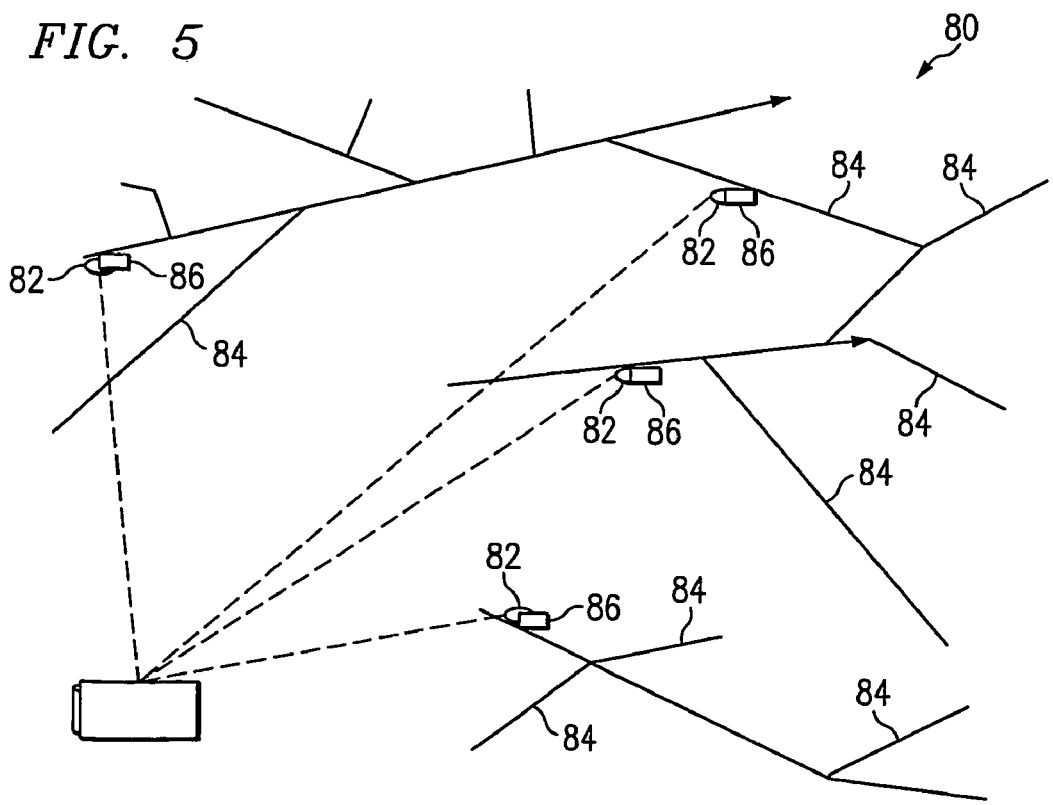
FIG. 5 is a schematic representation of a power transmission grid employing a plurality of magnetic couplers to provide real time information reflecting the condition of the grid.

Referring now to FIG. 5, a problem encountered in "wheeling" power between power grids is the lack of sufficient real time information needed to efficiently distribute and allocate available power over a distribution system. As described below, in one embodiment, the invention addresses this problem by supplying real time information that enables power distribution and redistribution between power grids on a real time basis. FIG. 5 illustrates a system according to the invention for monitoring a number of power transmission lines forming all or part of power distribution system or grid 80 includes a plurality of inductive couplers 82 positioned proximate power transmission lines 84 at different locations within for detecting voltage and current fluctuations in the power transmission lines. Each of couplers 82 is connected to a transmitter 86 that transmits a signal corresponding to the current and voltage fluctuations detected with the coupler to a receiving and processing station 90. Transmitters 86 may be wireless units such as a radio frequency transmitter or a hardwired unit such as a telephone modem and may be provided with any required signal processing equipment such as clocks, filters, converters and oscilloscopes as needed to process the collected data into a transmittable signal. The signal from each transmitter 86 is received at a central processing station 90, decoded, processed and integrated with the signals from other transmitters 86 to provide real time or near real time data reflecting the condition of the distribution system 80. The availability of this information on a real time basis enables efficient distribution and allocation of power over distribution system 80.

While certain embodiments of the invention have been illustrated for the purposes of this disclosure, numerous changes in the method and apparatus of the invention presented herein may be made by those skilled in the art, such changes being embodied within the scope and spirit of the present invention as defined in the appended claims.

The invention claimed is:

1. A power management system comprising:
   a sensor positioned adjacent an electrical transmission line carrying alternating current, the sensor comprising at least two measurement elements configured to generate a signal proportional to the magnitude of changes in the electro magnetic field surrounding the transmission line, wherein the sensor generates a signal proportional to a harmonic voltage on the transmission line; and
   a system for processing the signals generated by the elements comprising a computer and a database including historical data for the condition of the transmission line, the system processing the signals and generating an output that indicates changes in the condition of the power transmission line on a real time basis.

2. The power management system of claim 1 further comprising a database including one or more grid maps, the computer using the grid map to generate a graphical representation of a power distribution system connected to the transmission line including the location of the source of the change in condition of the transmission line.

3. The power management system of claim 2 further comprising a database including topographical information for the geographic area served by the power distribution system, the computer using the topographical information to generate a graphical representation of the power distribution system including the topology of the geographical area covered by the power distribution system.

4. The power management system of claim 1 wherein the sensor generates a signal proportional to a transient voltage on the power transmission line.

5. The power management system of claim 1 wherein the historical database includes data representing a previously measured transient on the power transmission line and the identity of the source of the transient.

6. A sensor configured to be positioned adjacent and parallel to an electrical transmission line carrying alternating current, comprising:
   a casing;
   a first electrical conductor disposed inside the casing having at least one turn therein to provide a pair of parallel linear segments of unequal length each extending in a lengthwise direction of the sensor;
   a second electrical conductor in the form of a coil disposed around the first conductor;
   a first lead connected to the first conductor for conducting a signal from the first conductor through the casing to an external signal analyzer; and
   a second lead connected to the second conductor for conducting a signal from the second conductor through the casing to an external signal analyzer.

7. The sensor of claim 6, wherein the first conductor comprises a pair of parallel coils spaced apart in the lengthwise direction of the sensor and a segment connecting the coils.

8. The sensor of claim 7, wherein axes of the pair of parallel coils are set at an angle in the range of 10 to 14 degrees relative to the lengthwise direction of the sensor.

9. The sensor of claim 7, wherein the first conductor has at least six turns at one end thereof providing at least seven parallel segments of different lengths effective for monitoring a range of emissions from the transmission line.

10. The sensor of claim 9, wherein the case comprises a solid cylinder made of electrically insulating plastic in which the first and second conductors are embedded.

11. The system of claim 1, wherein the sensor is positioned to one side of and parallel to the electrical transmission line.

12. An electrical power management system, comprising:
   a number of sensors positioned at different locations within an electric power distribution system, which sensors measure the magnitude of electrical changes at such locations;
   processors connected to receive a signal from each associated sensor, the processor processing the signals and generating an output that indicates changes in the condition of the power distribution system at that location;
   a computer that receives the outputs from the processors; and
   a database including one or more grid maps, the computer using the grid map to generate a graphical representation of the power distribution system, including a location of the source of a change in condition of the power distribution system.

13. The system of claim 12, wherein the sensors are positioned adjacent electrical transmission lines carrying alternating current.

14. The system of claim 13, wherein the sensors each comprise at least two measurement elements configured to generate a signal proportional to the magnitude of changes in the electro magnetic field surrounding the transmission line, whereby each sensor generates a signal proportional to a harmonic voltage on the transmission line.

15. The system of claim 12, further comprising a database including topographical information for the geographic area served by the power distribution system, the computer using the topographical information to generate a graphical representation of the power distribution system including the topology of the geographical area covered by the power distribution system.

16. A power management system comprising:
   a sensor positioned adjacent an electrical transmission line carrying alternating current, the sensor comprising at least two measurement elements configured to generate a signal proportional to the magnitude of changes in the electro magnetic field surrounding the transmission line, wherein the sensor generates a signal proportional to a harmonic voltage on the transmission line, wherein the first element is configured to generate an output that is phase shifted relative to the output of the second measurement element; and
   a system for processing the signals generated by the elements, the system processing the signals and generating an output that indicates changes in the condition of the power transmission line on a real time basis.

17. The power management system of claim 16 wherein the system for processing the signals include a computer and a database including historical data for the condition of the transmission line.

18. The power management system of claim 17 further comprising a database including one or more grid maps, the computer using the grid map to generate a graphical representation of a power distribution system connected to the transmission line including the location of the source of the change in condition of the transmission line.

19. The power management system of claim 18 further comprising a database including topographical information for the geographic area served by the power distribution system, the computer using the topographical information to generate a graphical representation of the power distribution system including the topology of the geographical area covered by the power distribution system.

20. The power management system of claim 16 wherein the sensor generates a signal proportional to a transient voltage on the power transmission line.

* * * * *